US012248229B2

(12) United States Patent
Yamashita

(10) Patent No.: US 12,248,229 B2
(45) Date of Patent: Mar. 11, 2025

(54) COOLING APPARATUS FOR ELECTRONIC APPARATUS

(71) Applicant: CANON KABUSHIKI KAISHA, Tokyo (JP)

(72) Inventor: Kenichiro Yamashita, Chiba (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 207 days.

(21) Appl. No.: 18/172,371

(22) Filed: Feb. 22, 2023

(65) Prior Publication Data

US 2023/0280639 A1      Sep. 7, 2023

(30) Foreign Application Priority Data

Mar. 1, 2022   (JP) .................. 2022-030864

(51) Int. Cl.
  *G03B 17/55*    (2021.01)
  *G03B 21/16*    (2006.01)
  *G03B 27/26*    (2006.01)
  *H04N 23/52*    (2023.01)
  *H05K 5/02*     (2006.01)
  *H05K 7/20*     (2006.01)

(52) U.S. Cl.
  CPC .......... *G03B 17/55* (2013.01); *H04N 23/52* (2023.01); *H05K 7/20145* (2013.01); *H05K 7/20154* (2013.01); *H05K 7/20172* (2013.01)

(58) Field of Classification Search
  CPC ........ G03B 17/55; G03B 21/16; G03B 27/26; H04N 23/52; H05K 7/2019; H05K 7/20209; H05K 7/20145; H05K 7/20154; H05K 5/0213; H05K 7/20172
  See application file for complete search history.

(56) References Cited

U.S. PATENT DOCUMENTS

| 2004/0107372 | A1* | 6/2004 | Morisawa | H02J 9/005 713/300 |
| 2007/0024819 | A1* | 2/2007 | Halls | G03B 21/16 353/58 |
| 2009/0002549 | A1* | 1/2009 | Kobayashy | H04N 23/52 348/374 |
| 2014/0055671 | A1* | 2/2014 | Kawamura | H04N 23/51 348/374 |
| 2018/0376037 | A1* | 12/2018 | Arai | H05K 7/20172 |

FOREIGN PATENT DOCUMENTS

| JP | H10285441 A | * 10/1998 | ............ H04N 5/225 |
| JP | 2009-071516 A | 4/2009 | |

* cited by examiner

*Primary Examiner* — Marly S Camargo

(74) *Attorney, Agent, or Firm* — Cowan, Liebowitz & Latman, P.C.

(57) ABSTRACT

A cooling apparatus includes a body frame holding a fan. The fan includes a blade housed in a casing and rotating about a fan shaft and discharges air from a casing's fan inlet opening surrounding the fan shaft into a casing's fan exhaust opening on a tangent line of the blade's rotational direction. The body frame includes an air-leading duct feeding the discharged air to a heat exchanger in a first direction. The fan tilts by a first tilt from a first plane orthogonal to the first direction to position, in the first direction, the fan exhaust opening closer to the heat exchanger than the blade, and by a second tilt about the fan shaft to tilt, as viewed from the first direction, the fan exhaust opening from a direction parallel to a second plane parallel to the first direction.

12 Claims, 9 Drawing Sheets

COOLING APPARATUS FOR ELECTRONIC APPARATUS

BACKGROUND OF THE INVENTION

Field of the Invention

The aspect of the embodiments relates to a cooling apparatus used as an external apparatus for electronic apparatuses such as image pickup apparatuses.

Description of the Related Art

In an image pickup apparatus, such as a digital camera, internally provided electronic components, such as an image sensor and an image processing element, are to be cooled by discharging heat generated by the electronic components. Japanese Patent Laid-Open No. ("JP") 2009-71516 discloses a cooling apparatus that is attached to a camera including a duct for feeding cooling air to an image sensor and includes a fan that feeds air to the duct.

In order that a plurality of electronic components disposed in a wide range in the image pickup apparatus are efficiently cooled, a fan is to feed a sufficient flowing amount of air to the image pickup apparatus. At this time, the fan may have a size as large as possible and may rotate at a low rotational speed so that noise and vibration caused by a rotation of the fan do not affect imaging.

However, if a large fan is simply put inside a cooling apparatus, the cooling apparatus becomes large. The cooling apparatus disclosed in JP 2009-71516 has a layout in which a fan and a battery housing portion are stacked in two stages, but if the size of the fan increases with this layout, the cooling apparatus becomes large.

SUMMARY OF THE INVENTION

The present disclosure provides a small cooling apparatus that can efficiently feed cooling air to an electronic apparatus with a fan.

A cooling apparatus according to one aspect of embodiments of the disclosure feeds cooling air to a heat exchanger of an electronic apparatus. The cooling apparatus includes a fan and a body frame configured to hold the fan. The fan includes a blade configured to be housed in a casing and to rotate about a fan shaft, and discharges air drawn from a fan inlet opening of the casing into a fan exhaust opening of the casing. The fan inlet opening surrounds the fan shaft. The fan exhaust opening is provided in a tangent line direction of a rotational direction of the blade. The body frame includes an air-leading duct configured to feed, to the heat exchanger, the air discharged into the fan exhaust opening. A first direction is a direction in which air is fed from the air-leading duct to the heat exchanger, a first plane is a plane orthogonal to the first direction, and a second plane is a plane parallel to the first direction. The fan is tilted by a first tilt relatively to the first plane so that, in the first direction, the fan exhaust opening is closer to the heat exchanger than the blade, and is tilted by a second tilt about the fan shaft so that in a view from the first direction, the fan exhaust opening is tilted relatively to a direction parallel to the second plane.

An electronic apparatus including the cooling apparatus and an image pickup apparatus including the cooling apparatus also constitute aspects of the embodiments.

Further features of the present invention will become apparent from the following description of exemplary embodiments with reference to the attached drawings.

DESCRIPTION OF THE EMBODIMENTS

Referring now to the accompanying drawings, a description is given of embodiments according to the present disclosure.

Figure 1A:
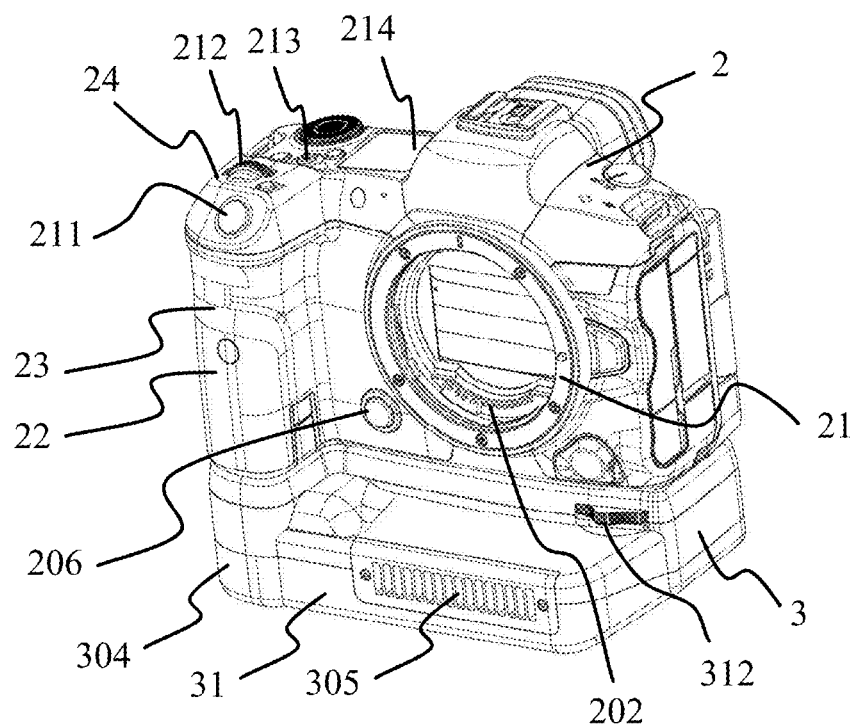
FIGS. 1A and 1B are external perspective views illustrating a cooling accessory and a camera main body according to an embodiment.
Figure 1B:
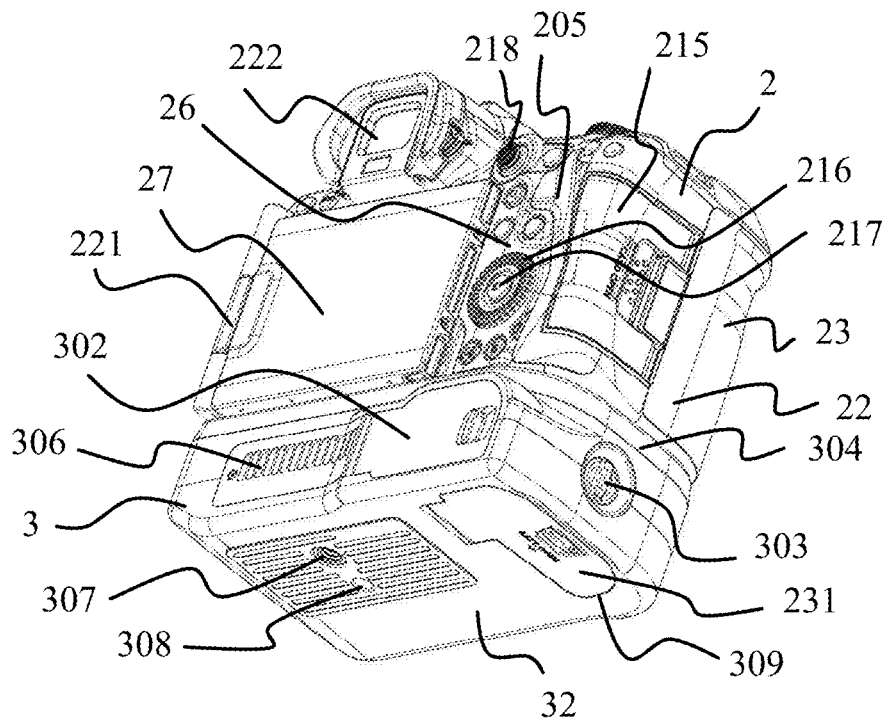

FIGS. 1A and 1B respectively illustrate external views from a front surface side and a bottom surface side of a cooling accessory 3 as a cooling apparatus and an image pickup apparatus (hereinafter referred to as a camera) 2 as an electronic apparatus to which the cooling accessory 3 is attached, according to an embodiment of the present disclosure. The camera 2 is a mirrorless type digital camera not including a quick return mirror. As illustrated in FIG. 1A, the camera 2 includes a mount 21 on a front surface, and an interchangeable lens unit (not illustrated) is detachably attached to the mount 21. Inside the mount 21, a communication terminal 202 is provided so that communication is performed between the camera 2 and the interchangeable lens unit.

At the right end, the camera 2 includes a grip portion 22 for a user to grip the camera 2 with a hand. The grip portion 22 is provided in an area extending from a grip projection portion 23 projecting to a front side to a rear surface rubber 205 illustrated in FIG. 1B. A stop-narrowing button 206 is located between the grip projection portion 23 and the mount 21 on the front surface of the camera 2. In a case where the user presses the stop-narrowing button 206, the camera 2 communicates a stop-narrowing instruction to the interchangeable lens unit, and the interchangeable lens unit narrows an aperture stop inside the interchangeable lens unit. This allows the user to check a depth of field.

In an area above the grip portion 22, an upper surface cover 24 of the camera 2 includes a shutter button 211, a main electronic dial 212, a motion imaging start/stop button 213, and an upper display panel 214. The shutter button 211 is operated to provide an instruction for still imaging, and the main electronic dial 212 is operated to select an imaging mode of the camera 2 and the like. The motion imaging start/stop button 213 is operated to provide instructions for starting and stopping motion imaging, and the upper display panel 214 displays a selected imaging mode or setting values such as a shutter speed and an aperture value.

In FIG. 1B, a card slot cover 215 is provided on a side of the grip portion 22. The card slot cover 215 is a lid that covers a slot (not illustrated) to which a recording medium is attached, and the card slot cover 215 is opened when the recording medium is inserted or ejected.

On the rear surface cover 26, the camera 2 includes a sub-electronic dial 216, a SET button 217, a multi-controller 218, a vari-angle monitor 27, and a viewfinder eyepiece 222. The sub-electronic dial 216 is operated in combination with an operation on the above-described main electronic dial 212 when various setting values are to be changed. The SET button 217 provided in the center of the sub-electronic dial 216 is operated to select a selection item in the setting menu of the camera 2. A key top of the multi-controller 218 can be pushed or tilted in eight directions, and is operated to move a photometry frame or a focus detection frame, to change or determine a selection item in the setting menu, or the like.

The vari-angle monitor 27 includes a display device such as a TFT liquid crystal, displays a live view image before imaging and a captured image, and displays the setting menu, various setting values, and the like. The vari-angle monitor 27 can rotate in an upper-lower direction and in a left-right direction about a hinge 221 provided on a side surface of the rear surface cover 26, the side surface being opposite to the grip portion 22. The drawing illustrates a state in which a display surface of the vari-angle monitor 27 faces the camera and the vari-angle monitor 27 is housed in a monitor housing provided on the rear surface cover 26.

The viewfinder eyepiece 222 is a part to which the user brings a user's eye close so as to view an electronic viewfinder that displays similar images as the vari-angle monitor 27.

In FIG. 1B, the right side of the rear surface of the cooling accessory 3 is provided with a battery lid 302 that is opened when a battery housed in the cooling accessory 3 is inserted or ejected. The battery is used to drive a fan (described later) inside the cooling accessory 3. A right-side surface of the cooling accessory 3 includes a main switch 303 operated by the user to turn on/off functions of the cooling accessory 3. A surface from the front to the side of a right part of the cooling accessory 3 is a grip assisting surface 304 having a shape continuing the grip portion 22 of the camera 2. The user can grip a wide area including the grip assisting surface 304 and the grip portion 22. Therefore, the right part of the cooling accessory 3 may not have a shape projecting from the grip portion 22 of the camera 2.

Louvers 306 and 305 including grid-like holes are respectively provided on a left side of the battery lid 302 of the rear surface of the cooling accessory 3 and a front surface of the front projecting portion 31 illustrated in FIG. 1A. The louvers 305 and 306 are provided on openings (accessory inlet opening) through which outside air enters the cooling accessory 3. The bottom surface portion 32 of the cooling accessory 3 includes a tripod internal screw 307 for fixing the camera 2 to an unillustrated tripod (another member) via the cooling accessory 3 and a rotation stopping boss hole 308 with which a rotation stopping boss provided on the tripod is engaged. A tripod screw dial 312 that is rotated by the user when the cooling accessory 3 is attached to the bottom surface of the camera 2 is provided near the left end of the front surface of the camera 2.

The camera battery lid 231 that has been detached from the camera 2 when the cooling accessory 3 is attached is held by a battery lid holding portion 309 provided on the bottom surface of the cooling accessory 3.

Figure 2A:
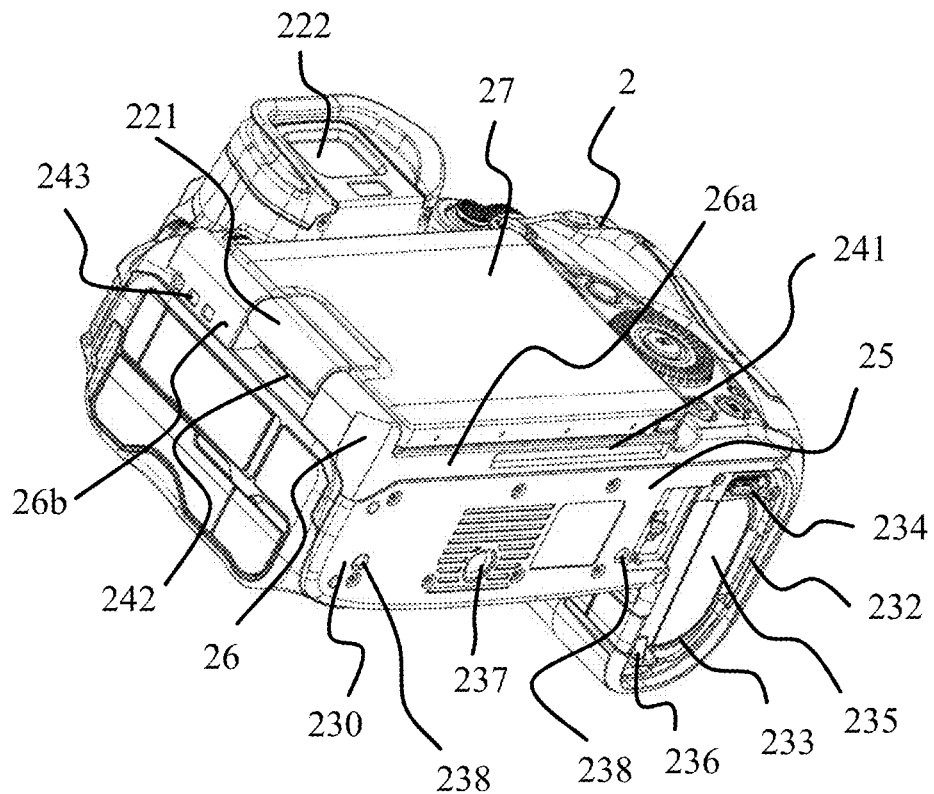
FIGS. 2A and 2B are external perspective views illustrating the camera main body.
Figure 2B:
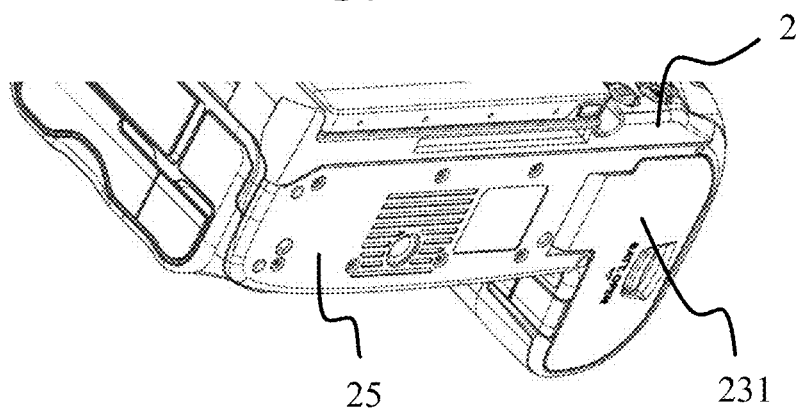

FIGS. 2A and 2B illustrate the camera 2 alone (with the cooling accessory 3 detached) viewed from the bottom surface side. As illustrated in FIG. 2A, the bottom surface portion 25 of the camera 2 includes a camera battery chamber opening 232. The battery 235 is housed inside the camera battery chamber opening 232. In a case where the camera 2 is used alone without the cooling accessory 3, the camera battery lid 231 is attached to the bottom surface portion 25 of the camera 2 so that the camera battery chamber opening 232 is closed, as illustrated in FIG. 2B. On the other hand, in a case where the cooling accessory 3 is attached to the camera 2, the camera battery lid 231 is detached from the bottom surface portion 25 of the camera 2 and the camera battery chamber opening 232 is opened as illustrated in FIG. 2A. This exposes a receptacle connector 234 located inside the camera battery chamber opening 232. The receptacle connector 234 is used to transmit/receive electrical signals with various accessories attachable to the camera 2 including the cooling accessory 3. Even when the camera battery chamber opening 232 is not closed by the camera battery lid 231, the battery 235 is held by a battery lock lever 236 and therefore the battery 235 does not fall off.

A bottom surface forming portion 26a, which is part of the bottom surface portion 25 of the rear surface cover 26 of the camera 2, includes a camera inlet opening 241 having a rectangular shape, and the rectangular shape is thin in the front-rear direction and has a width of about ⅓ of the overall width in the left-right direction of the camera 2. A left surface forming portion 26b, which is part of the left surface of the camera 2 and is included in the rear surface cover 26, includes camera exhaust openings 242 and 243 adjacent to the hinge 221 of the vari-angle monitor 27. In the front-rear direction of the camera 2, the positions of the camera exhaust openings 242 and 243 are the same as the position of the camera inlet opening 241.

The bottom surface portion 25 of the camera 2 includes a tripod internal screw 237 and two positioning holes 238 on the left and right sides of the tripod internal screw 237. The tripod internal screw 237 is used for fixing the camera 2 alone to the tripod and for attaching the cooling accessory 3 to the bottom surface portion 25 of the camera 2. The camera 2 and the cooling accessory 3 are positioned relatively to each other by engaging a below-described positioning pin provided on the cooling accessory 3 with the positioning hole 238.

Figure 3:
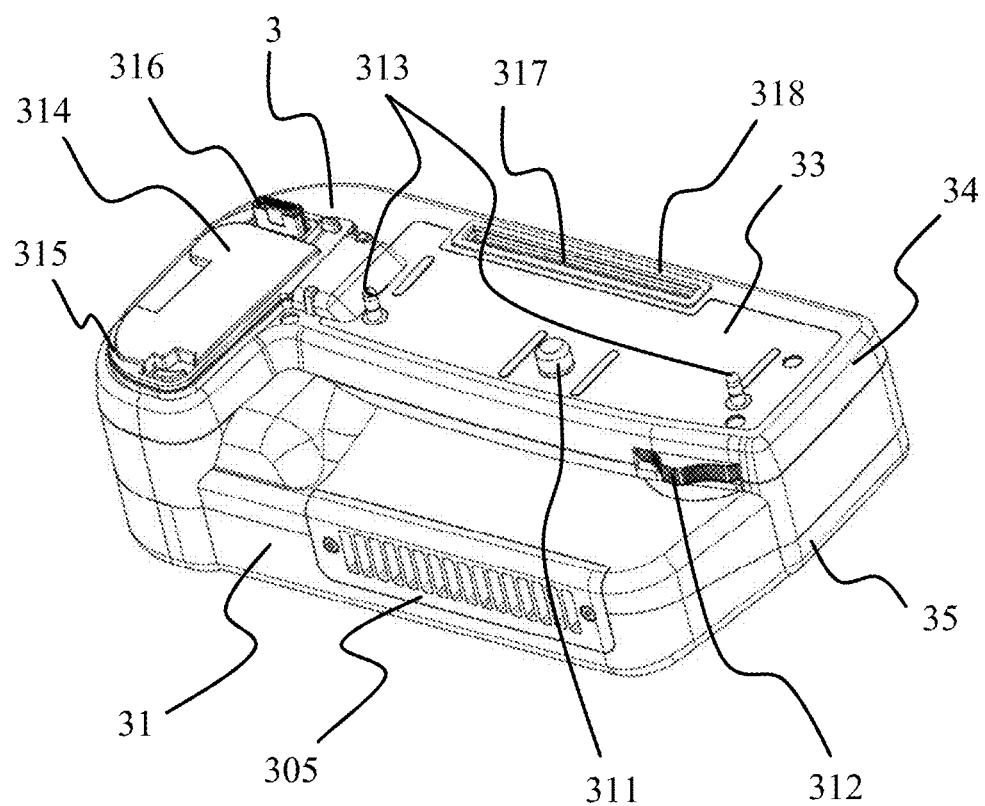
FIG. 3 is an external perspective view illustrating a cooling accessory.

FIG. 3 illustrates the cooling accessory 3 viewed from the upper side. An upper surface portion 33 of the cooling accessory 3 includes a tripod external screw 311 that rotates with a rotational operation on a tripod screw dial 312, which is also illustrated in FIG. 1A, and two positioning pins 313, each of which is to be engaged with the above-described positioning hole 238 of the bottom surface portion 25 of the camera. When the tripod external screw 311 rotated via the tripod screw dial 312 is screwed into the camera tripod internal screw 237, the cooling accessory 3 is attached to the camera 2.

A convex portion 314 having substantially the same shape as the camera battery chamber opening 232 and projecting slightly upward is provided on the grip portion side of the upper surface portion 33 of the cooling accessory 3. When the cooling accessory 3 is attached to the camera 2, the convex portion 314 closes the camera battery chamber opening 232 instead of the camera battery lid 231 when the camera battery lid 231 is detached. A drip-proof seal 315 surrounds an outer periphery of the convex portion 314 so as to fill a gap between the convex portion 314 and the camera battery chamber opening 232. A plug connector 316 that is to be connected to the receptacle connector 234 of the camera 2 is provided above the convex portion 314.

At the center of the upper surface portion 33, the cooling accessory 3 includes an accessory air-leading opening 317 having the same shape as the camera inlet opening 241 and connected to the camera inlet opening 241 in a state where the cooling accessory 3 is attached to the camera 2. An elastic air-leading opening seal 318 surrounds the accessory air-leading opening 317 so as to prevent air leakage by sealing a gap between the accessory air-leading opening 317 and the camera inlet opening 241.

Figure 4A:
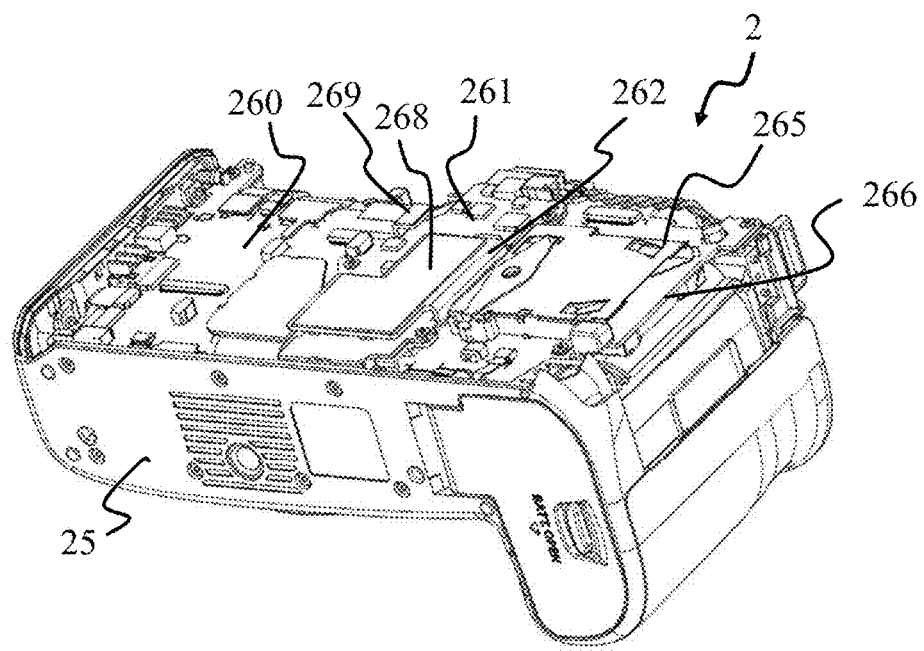
FIGS. 4A and 4B are exploded perspective views illustrating the camera main body.
Figure 4B:
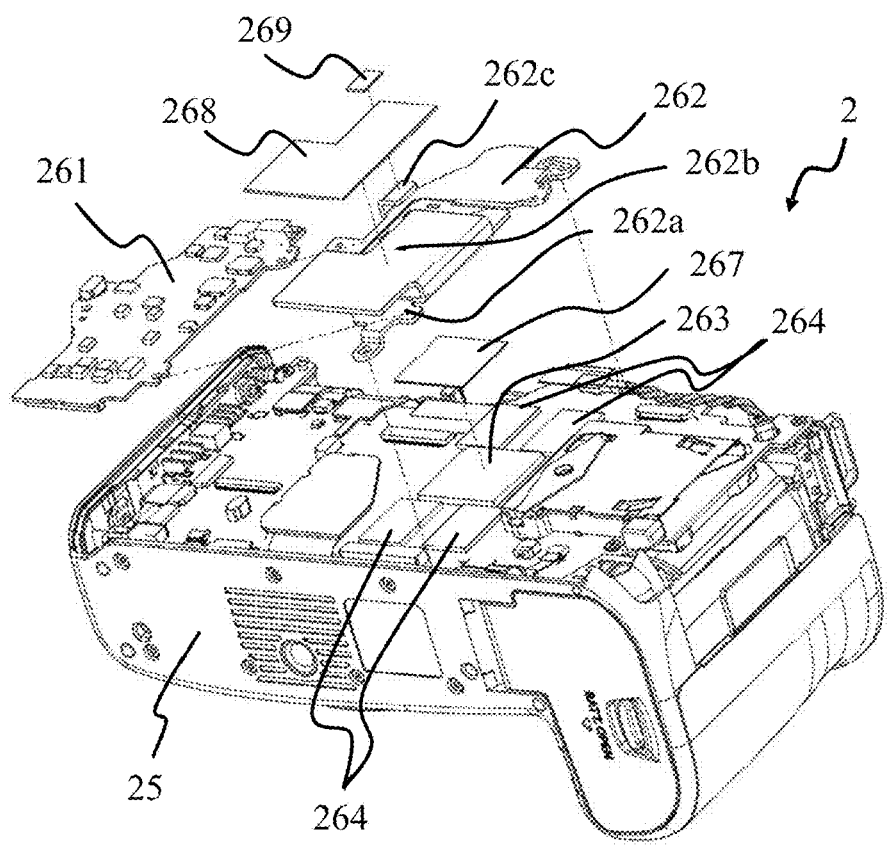

FIG. 4A illustrates an internal structure of the camera 2 in a state where exterior members such as the upper surface cover 24, the rear surface cover 26, and the card slot cover 215 are removed. FIG. 4B illustrates a state where some internal structures are exploded.

In FIG. 4A, a main substrate 260 and a power supply substrate 261 smaller than the main substrate 260 are disposed on the rear surface side inside the camera 2. The power supply substrate 261 is a substrate on which electronic components relating to a power supply circuit are mounted, and is supported by a plate 262 while a gap is provided between the power supply substrate 261 and the main substrate 260. The power supply substrate 261 overlaps the main substrate 260 in the front-rear direction, realizing a size reduction of the camera 2 in a view from the front side. Two card slots 265 and 266 are attached to the right of the power supply substrate 261 on the main substrate 260. The card slot 265 is, for example, a slot for an XQD card or a CF Express card, and the card slot 266 is, for example, a slot for an SD card.

In the center of the main substrate 260, an image processing IC 263 and a DRAM 264 for temporarily storing data to be used in processing executed by the image processing IC 263 are mounted. The image processing IC 263 is a processing element that processes signals output from an image sensor (IS in FIG. 8) to generate image data, and is an electronic component that becomes the hottest heat source on the main substrate 260. In particular, the image processing IC 263 consumes a large amount of power in motion image capturing with a large pixel number or a high frame rate, and thus generates a large amount of heat. A heat-conducting rubber 267 is attached to the surface of the image processing IC 263.

The plate 262 is made of metal material with high thermal conductivity, such as aluminum. The plate 262 is a component formed by performing a bending process on a metal plate, and has a heat-receiving surface 262a on the main substrate side and heat-transmitting surfaces 262b and 262c on the rear surface side of the camera 2. The power supply substrate 261 is disposed between the heat-receiving surface 262a and the heat-transmitting surfaces 262b and 262c of the plate 262 and overlaps the main substrate 260. The power supply substrate 261 and the plate 262 are fixed inside the camera 2 by screwing them together. The heat-receiving surface 262a of the plate 262 is in close contact with the heat-conducting rubber 267 provided on the surface of the image processing IC 263. Heat-conducting rubbers 268 and 269 are attached to the heat-transmitting surfaces 262b and 262c of the plate 262. Thus, a heat radiation path for the image processing IC 263 is formed.

Figure 5:
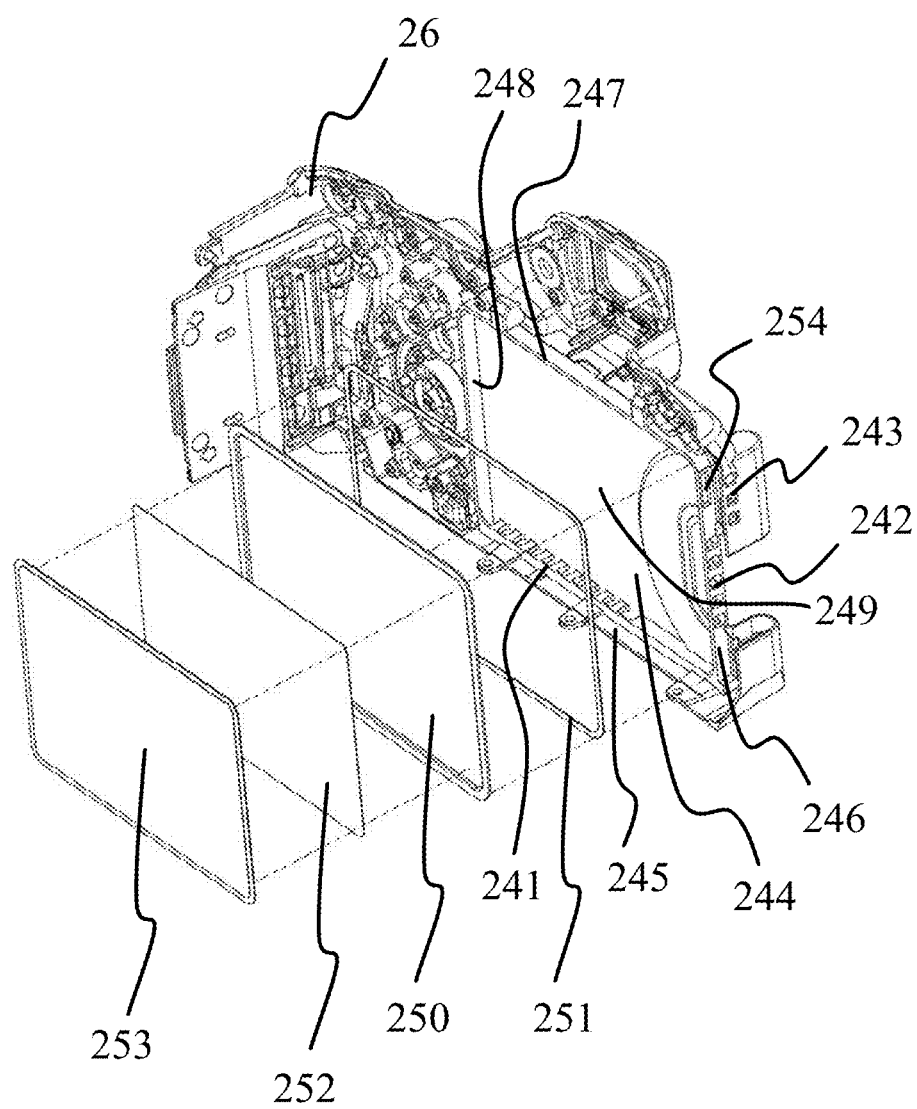
FIG. 5 is an exploded perspective view illustrating a rear surface duct of the camera main body.

FIG. 5 illustrates a configuration of a duct formed inside the rear surface cover 26 of the camera 2. The rear surface cover 26 has a partition wall portion 244 whose outer surface faces the vari-angle monitor 27 in above-described the monitor housing, and wall portions 245, 246, 247, and 248 that surround the upper, lower, left, and right sides of a space facing an inner surface of the partition wall portion 244. The camera inlet opening 241 is formed on the wall portion 245 on the bottom surface side, and the camera exhaust opening 242 and an opening 254 are formed on the right wall portion 246. The camera exhaust opening 243 is formed on a hinge receiving portion, which receives the hinge 221 of the vari-angle monitor 27, of the rear surface cover 26. An unillustrated member is attached between the opening 254 and the adjacent camera exhaust opening 243 and an air flowing path is formed.

A heat-radiation sheet metal 250 made of aluminum or the like having high thermal conductivity is attached and fixed to front end surfaces of the wall portions 245 to 248 with a frame-shaped double-sided tape 251. Fixing the heat-radiation sheet metal 250 to the front end surfaces of the wall portions 245 to 248 forms a camera duct portion 249 surrounded by the partition wall portion 244, the wall portions 245 to 248, and the heat-radiation sheet metal 250. Fixing the heat-radiation sheet metal 250 to the wall portions 245 to 248 with double-sided tape 251 without gaps prevents air leakage and entry of water and dust through the camera duct portion 249 into the camera 2. The camera duct portion 249 is an air flowing path having a wide projection area in the front-rear view from the camera inlet opening 241 to the camera exhaust openings 242 and 243, and functions as a heat exchanger.

In this embodiment, each of the camera inlet opening 241 and the camera exhaust opening 242 has a grid-like shape with equal intervals. This is to prevent foreign objects from going inside the camera duct portion 249, and the partitions of the grid may not be provided.

A thin heat radiation component 253 is attached with a double-sided tape 252 to a surface of the heat-radiation sheet metal 250 on a side opposite to the camera duct portion 249. Heat diffusion by the heat-radiation sheet metal 250 is supplemented with the thin heat radiation component 253 that is a vapor chamber or graphite sheet. The thin heat radiation component 253 may be fixed in close contact with the heat-radiation sheet metal 250 with heat conductive grease instead of the double-sided tape 252. The thin heat radiation component 253 may not be provided.

Figure 8:
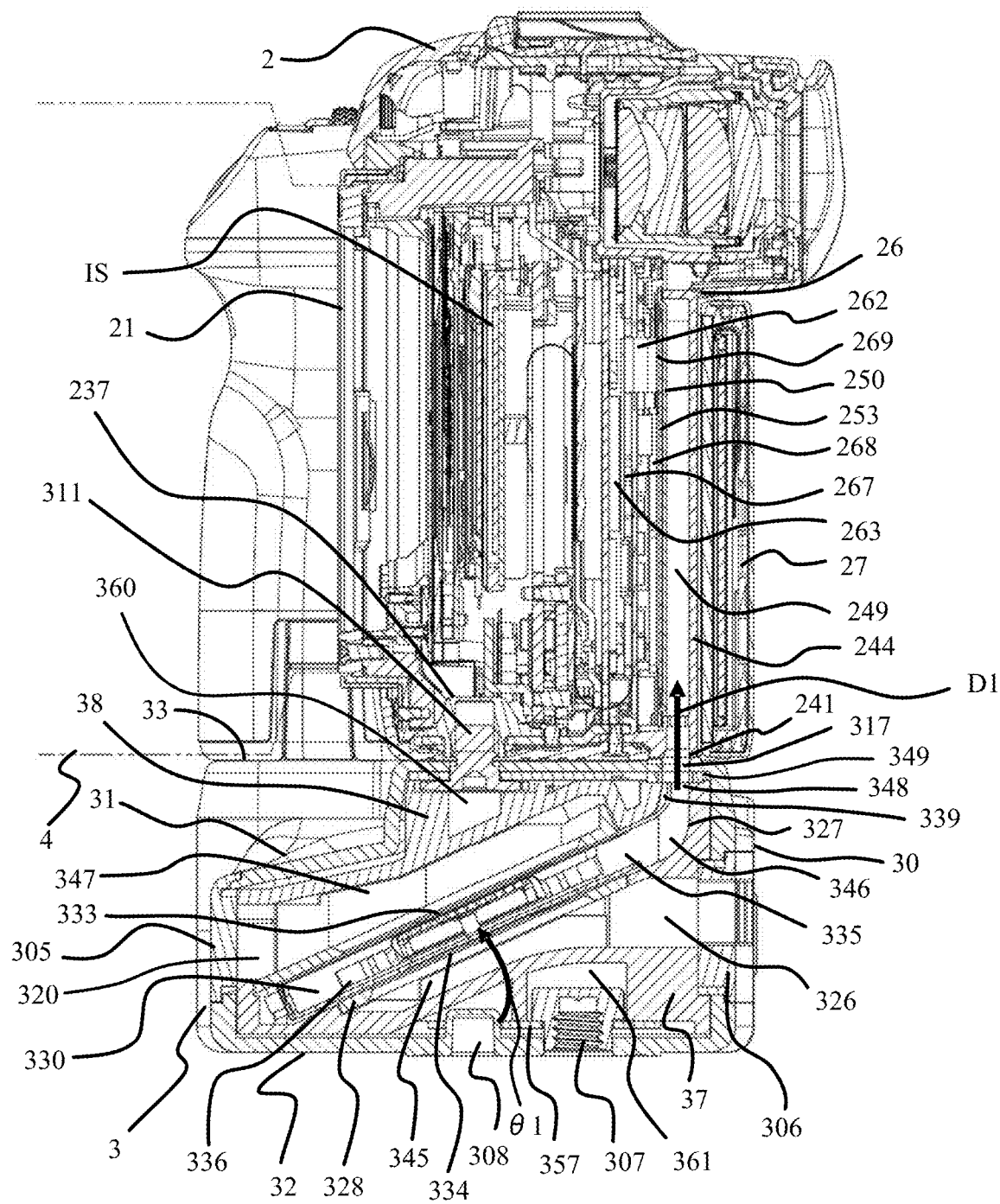
FIG. 8 is a side sectional view of the cooling accessory and the camera main body.

FIG. 8 illustrates a side-view section of the camera 2. When the rear surface cover 26 configured as illustrated in FIG. 5 is attached to the camera 2, the thin heat radiation component 253 comes into close contact with the heat-conducting rubbers 268 and 269, which are attached to the plate 262. Therefore, the heat generated by the image processing IC 263 is transferred to the thin heat radiation component 253 via the plate 262 and the heat-conducting rubbers 268 and 269. The heat transferred to the thin heat radiation component 253 is diffused over a wide range of the heat-radiation sheet metal 250 by a heat conduction effect of the thin heat radiation component 253. The heat diffused to the heat-radiation sheet metal 250 is transferred to the air flowing from the cooling accessory 3 into the camera duct portion 249 via the camera inlet opening 241, and the air with the heat is emitted to the outside via the camera exhaust openings 242 and 243.

Figure 6:
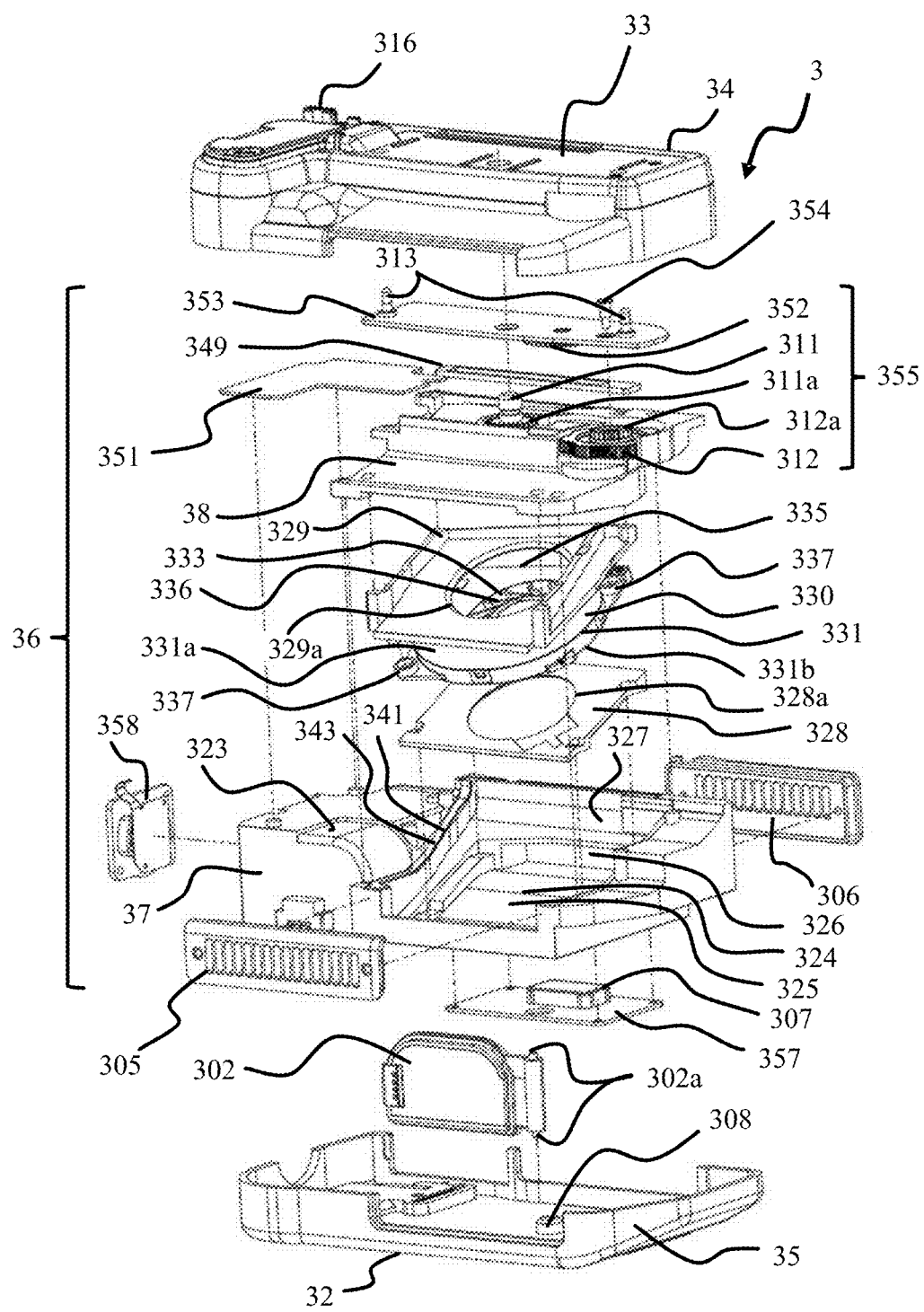
FIG. 6 is an exploded perspective view illustrating the cooling accessory.

FIG. 6 illustrates an internal structure of the cooling accessory 3 viewed from the front side. The cooling accessory 3 is roughly divided into an upper cover 34 which is an upper exterior member, a lower cover 35 which is an exterior member on the bottom surface side, and a main body unit 36 which is an internal structure.

The left part in FIG. 6 of the main body case 37, which is the base of the main body unit 36, is a battery housing portion 323 provided with the battery lid 302 illustrated in FIG. 1B on the rear side (rear surface side). A fan housing portion 324 that opens upward is formed in the main body case 37 excluding the battery housing portion 323. The fan housing portion 324 is tilted so that the height of the fan housing portion 324 increases from front to rear. A floor surface 325 of the fan housing portion 324 is connected to a lower inlet duct opening 326 that increases in height from the front to the rear and opens to the rear side of the fan housing portion 324. On the upper side of the lower inlet duct opening 326, an air-leading duct wall portion 327 that smoothly transitions rearward from a tilted surface to a vertical surface is formed.

The fan housing portion 324 houses inside a partition plate 328 having a circular hole 328a formed in the center and a fan holding plate 329 having a circular hole 329a formed in the center and holding a fan 330. A main body cover 38 is placed above the fan holding plate 329, and fixing the main body cover 38 to the main body case 37 by screwing closes the upper opening of the fan housing portion 324. The partition plate 328 is directly attached to the fan housing portion 324, and the fan holding plate 329 is attached to the main body cover 38 in a manner of being suspended from the main body cover 38. The main body case 37 and the main body cover 38 are included in a body frame of the cooling accessory 3.

The fan 330 includes a thin casing 331 and a rotatable blade 336 housed in the casing 331. An upper surface 331a of the casing 331 has an upper fan inlet opening 333 corresponding to the above-described circular hole 328a, and a lower surface 331b of the casing 331 has a lower fan inlet opening 334 corresponding to the above-described circular hole 329a as illustrated in FIG. 8. That is, on both sides of the casing 331 in a direction in which a rotational center axis of the blade 336 (hereinafter referred to as a fan shaft) extends, the upper fan inlet opening 333 as a first fan inlet opening and the lower fan inlet opening 334 as a second fan inlet opening are provided around (surround) the fan shaft.

The fan 330 is a centrifugal fan that, as the blade 336 rotates, bends air drawn in from the upper and lower fan inlet openings 333 and 334 by 90° in the casing 331 and discharges the air into the fan exhaust opening 335 provided in a specific tangent line direction (on the rear side) relatively to the rotational direction of the blade 336. The fan exhaust opening 335 has a thin rectangular shape extending parallelly to the upper surface 331a and the lower surface 331b of the casing 331.

In order that noise and vibration caused by rotation of a fan are reduced, the fan may have a size as large as possible and may rotate at a rotational speed as low as possible. Therefore, this embodiment uses, as the fan 330, a large fan that is housed in most of the interior of the cooling accessory 3 excluding the battery housing portion 323. In addition, the fan 330 is attached to the fan holding plate 329 via a rubber bush 337. This makes it difficult for the vibration of the fan 330 during rotation to be transmitted to the main body case 37, the upper cover 34, and the lower cover 35 of the cooling accessory 3.

A sealing member 343 is attached to an upper end surface 341 of the left and right wall portions of the fan housing portion 324, and the main body cover 38 is in close contact with the sealing member 343. This prevents air from leaking from the inside of the fan housing portion 324.

As illustrated in FIG. 8, the partition plate 328 and the fan holding plate 329 partition, into three spaces, the fan housing portion 324, whose upper opening is closed by the main body cover 38. The uppermost space is used as an upper inlet duct (first inlet duct) 347 for drawing air from the outside to the upper fan inlet opening 333 and the lowest space is used as a lower inlet duct (second inlet duct) 345 for drawing air from the outside to the lower fan inlet opening 334. The intermediate space is used as an air-leading duct 346 that guides the air, which has been discharged into the fan exhaust opening 335, to the camera inlet opening 241 of the camera 2. The air-leading duct 346 feeds air to the camera inlet opening 241 via the air-leading duct outlet 348 and the accessory air-leading opening 317. A direction D1 in which air is fed from the air-leading duct 346 (air-leading duct outlet 348) to the camera inlet opening 241 (upward direction in FIG. 8) corresponds to a first direction.

The fan 330 tilts relatively to the upper surface portion 33 and the bottom surface portion 32 so that the rear side (fan exhaust opening side) of the fan 330 is located at a higher position than the position of the front side (blade side) of the fan 330 in the cooling accessory 3. The upper surface portion 33 and the bottom surface portion 32 correspond to a first plane orthogonal to the first direction and are surfaces orthogonal to the rear surface cover 26 in a state where the cooling accessory 3 is attached to the camera 2. The lower inlet duct 345 and the upper inlet duct 347 are spaces tilting relatively to the upper surface portion 33 and the bottom surface portion 32 and extending along the tilt of the fan 330.

The upper inlet duct 347 is connected to the outside through an upper inlet duct opening 320 formed between a front part of the main body case 37 and a front part of the main body cover 38. The lower inlet duct 345 is connected to the outside of the cooling accessory 3 via a lower inlet duct opening 326 formed at a rear part of the main body case 37. Thus, the upper inlet duct opening 320 and the lower inlet duct opening 326 are provided on different sides (opposite sides) to each other of the body frame of the cooling accessory 3. The above-described louver 306 is attached to the lower inlet duct opening 326, and the above-described louver 305 is attached to the upper inlet duct opening 320.

The air-leading duct 346 connected to the fan exhaust opening 335 is formed between the air-leading duct wall portion 327 formed in the main body case 37 and the air-leading duct wall portion 339 formed in the main body cover 38. In the main body unit 36, the air-leading duct 346 extends from the fan exhaust opening 335 in a gentle upward turn (at an angle greater than 90°) to an air-leading duct outlet 348 connected to the accessory air-leading opening 317. Furthermore, the air-leading duct 346 has a shape that becomes narrower toward the fan exhaust opening 335 and the accessory air-leading opening 317, which is thinner than the fan exhaust opening 335. At a position between the air-leading duct outlet 348 and the accessory air-leading opening 317 on the bottom surface of the upper cover 34, an outlet seal member 349 for preventing air leakage surrounds the air-leading duct outlet 348 on the top surface of the air-leading duct wall portions 327 and 339.

In FIG. 6, an accessory control substrate 351 is attached to the upper surface of the battery housing portion 323 in the main body case 37, and an unillustrated microcomputer (CPU, etc.) that controls communication with the camera 2 and rotation of the fan 330 is mounted on the accessory control substrate 351.

A concave portion of the upper surface of the main body cover 38 accommodates the above-described tripod external screw 311 and the tripod screw dial 312, and a top plate 353 is attached to the main body cover 38 so that the tripod external screw 311 and the tripod screw dial 312 are covered. The top plate 353 includes the above-described two positioning pins 313 and holds an idler gear 352 rotatably. When the top plate 353 is attached to the main body cover 38, the idler gear 352 meshes with gears 311a and 312a formed on the tripod external screw 311 and on the tripod screw dial 312, forming a tripod screwing mechanism 355.

A stepped screw 354 is screwed through the top plate 353 into the center of the tripod screw dial 312. Thereby, the tripod screw dial 312 is rotatably held by the main body cover 38 and the top plate 353.

Figure 7A:
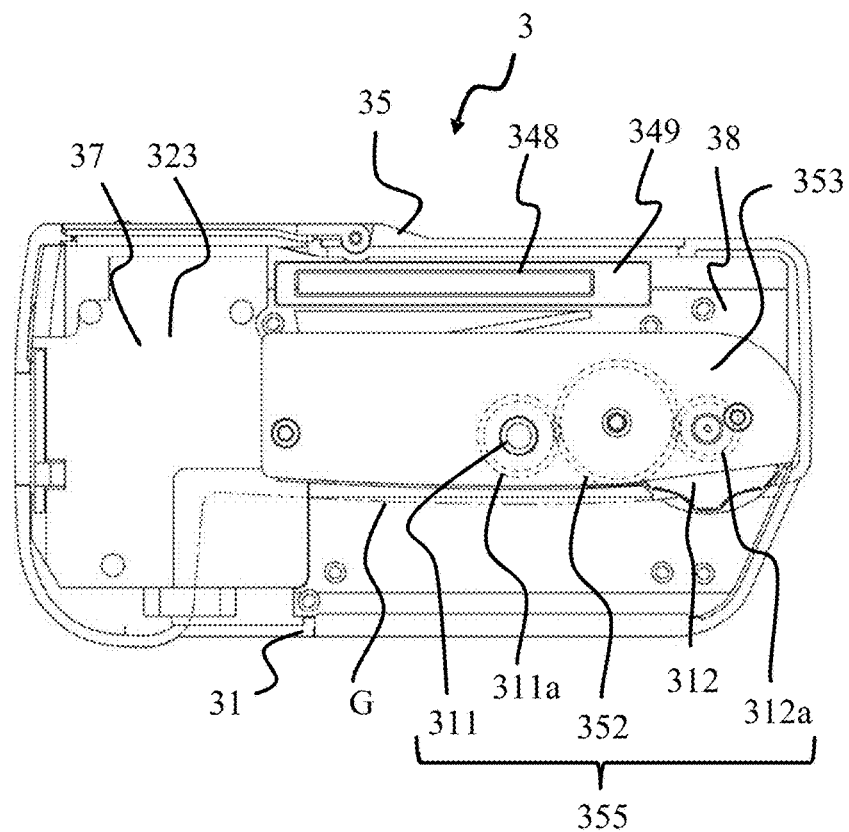
FIGS. 7A and 7B are plan views illustrating an internal configuration of the cooling accessory.

FIG. 7A illustrates the cooling accessory 3 without the upper cover 34 as viewed from the upper side. A geared portion of the tripod screwing mechanism 355 located below the top plate 353 is represented by dashed lines. A two-dot chain line G represents a contour of the front side of the cooling accessory 3 at a height at which the tripod screwing mechanism 355 is located. The tripod screwing mechanism 355 is positioned at a position close to the front surface of the cooling accessory 3 (two-dot chain line G).

In FIG. 6, a main switch unit 358 is attached to the right side surface of the battery housing portion 323 in the main body case 37. A bottom plate 357 to which the above-described tripod internal screw 307 is fixed is attached to the lower surface of the main body case 37.

The bottom surface of the lower cover 35 attached to the main body case 37 from the lower side is integrally formed with the above-described rotation stopping boss hole 308. A plug connector 316 illustrated in FIG. 3 is mounted on an unillustrated board and attached to the upper cover 34 attached to the upper side of the main body case 37. The battery lid 302 is rotatably attached (attached so that the battery lid 302 can be opened and closed) to both the upper cover 34 and the lower cover 35 with a hinge shaft 302a engaged with both the upper cover 34 and the lower cover 35.

Next, with reference to FIG. 8, a detailed description is given of an arrangement of the fan 330 inside the cooling accessory 3. The cooling accessory 3 includes a front projecting portion 31 that projects forward from the mount 21 in a state where the cooling accessory 3 is attached to the camera 2, and the fan 330 and the air-leading duct 346 are disposed so that they occupy an entire length in the front-rear direction of the inside of the cooling accessory 3 including the front projecting portion 31. The fan 330 (the upper surface 331a and the lower surface 331b of the casing 331) is tilted by a first tilt θ1 relatively to the upper surface portion 33 and the bottom surface portion 32 of the cooling accessory 3. The upper inlet duct 347 and the lower inlet duct 345 are also tilted along the fan 330.

The tripod external screw 311 included in the tripod screwing mechanism 355 is located in a space 360 formed above the upper inlet duct 347 in the main body cover 38 by the tilts of the fan 330 and the upper inlet duct 347. The upper surface of the front projecting portion 31 is formed so that the height decreases toward the front side along with the tilt of the upper inlet duct 347. An interchangeable lens unit 4 extending forward from the camera 2 is attached to the mount 21 as indicated by a two-dot chain in the drawing. At this time, the upper surface, which faces the interchangeable lens unit 4, of the front projecting portion 31 is formed so that the upper surface becomes farther from an optical axis of the interchangeable lens unit 4 toward the front side (lens extending direction).

The rotation stopping boss hole 308 and the tripod internal screw 307 are located in a space 361 (area in which the main body case 37 overlaps the lower inlet duct 345 in the first direction) formed below the lower inlet duct 345 in the main body case 37 by the tilts of the fan 330 and the lower inlet duct 345. The tripod external screw 311, the rotation stopping boss hole 308, and the tripod internal screw 307 form a mounting mechanism, and the mounting mechanism forms a second functional unit.

Figure 7B:
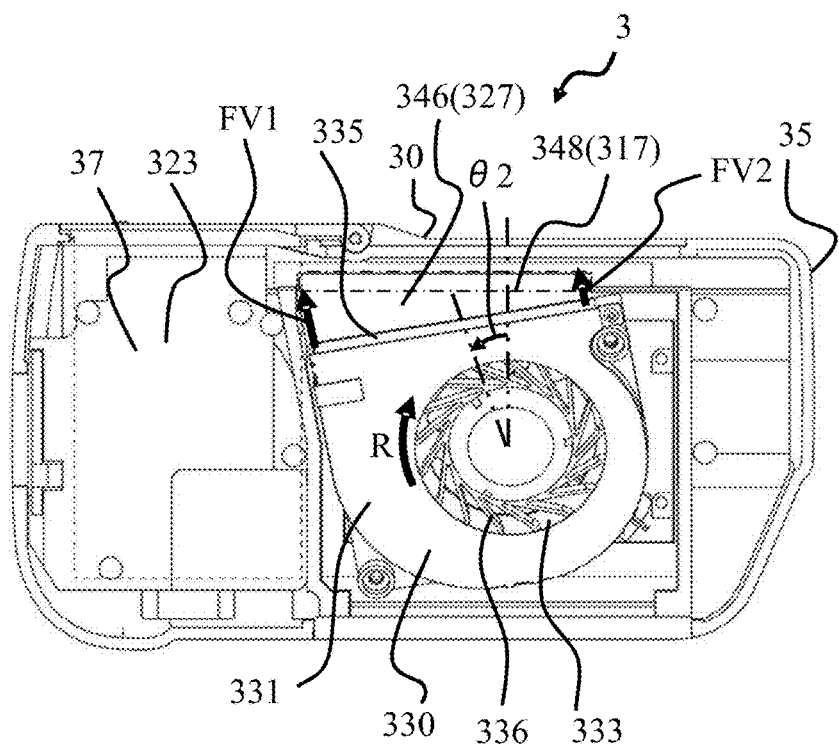

FIG. 7B illustrates the fan 330 in the cooling accessory 3 viewed from the upper side. This drawing illustrates a state where all members above the fan 330 in the cooling accessory 3 are removed, and the one-dot chain line represents a range of the opening of the air-leading duct outlet 348 (and the accessory air-leading opening 317 above it). The fan 330 is disposed inside the fan housing portion 324 adjacent to the battery housing portion 323 in the left-right direction.

If the fan 330 is arranged so that the longitudinal direction of the fan exhaust opening 335 is parallel to the rear surface portion 30 of the cooling accessory 3 (so that the fan exhaust opening faces the exact far side), the fan 330 does not fit inside the fan housing portion 324, whose size is limited by the above-described limitation of the grip assisting surface 304. Specifically, if the fan exhaust opening 335 is rotated clockwise about the fan shaft from the position illustrated in the drawing so that the fan exhaust opening 335 faces the exact rear side, the fan exhaust opening 335 shifts to the left side (right side in the drawing) relatively to the accessory air-leading opening 317. In this case, air is not efficiently led from the accessory air-leading opening 317 to the entire camera inlet opening 241.

For this reason, in this embodiment, the fan 330 is tilted by a second tilt θ2 in the counterclockwise direction about the fan shaft in the upper view of FIG. 7B so that the longitudinal direction of the fan exhaust opening 335 is not parallel, rather than being parallel, to the left-right direction in which the rear surface portion 30 of the cooling accessory 3 extends. The rear surface portion 30 corresponds to a second plane parallel to the first direction (orthogonal to the first plane), and the left-right direction corresponds to a second direction orthogonal to the first direction and parallel to the second plane.

In the left-right direction, the center of the air-leading duct 346 (air-leading duct outlet 348) is located on the left side (first side) of the fan shaft. The second tilt rotates the fan 330 about the fan shaft so that the fan exhaust opening 335 faces the air-leading duct 346 side. Thereby, air discharged from the fan 330 can be efficiently fed from the air-leading duct 346 and the accessory air-leading opening 317 to the camera inlet opening 241 while the shape of the air-leading duct 346 is not complicated.

In this embodiment, the magnitude of the first tilt of the fan 330 relative to the front-rear direction is constant in the left-right direction, but the fan may be positioned so that the magnitude of the first tilt changes in the left-right direction. That is, the fan may be tilted relatively to the front-rear direction and also tilted relatively to the left-right direction. Furthermore, the fan tilted relatively to the front-rear direction and relatively to the left-right direction may be rotated about the center of the fan so that the longitudinal direction of the fan exhaust opening is tilted by a second tilt relatively to the left-right direction.

The entire longitudinal direction of the fan exhaust opening 335 faces the entire longitudinal direction of the accessory air-leading opening 317 as described above. However, the second tilt makes a distance from the fan exhaust opening 335 to the accessory air-leading opening 317, that is, a flowing path length of the air-leading duct 346, unequal in the longitudinal directions of the fan exhaust opening 335 and the accessory air-leading opening 317. Specifically, the flowing path length of the air-leading duct 346 is longer on the left side in FIG. 7B and shorter on the right side in FIG. 7B. This difference in the flowing path length causes a difference in flowing path resistance in the longitudinal direction of the fan exhaust opening 335 and the accessory air-leading opening 317 and affects airflow in the air-leading duct 346. Therefore, this embodiment adopts the following positioning of the fan 330 so as to reduce the effect of the above-described difference in the flowing path lengths.

The rotational direction of the blade 336 of fan 330 is clockwise as indicated by an arrow R in FIG. 7B. In this case, characteristics of the centrifugal fan make air amounts (flowing velocity) discharged from the fan exhaust opening 335 have a distribution as represented by the lengths of arrows FV1 and FV2 in the drawing. That is, the flowing velocity of air discharged from a left side area (first area) of the fan exhaust opening 335 is faster than the flowing velocity of air discharged from a right side area (second area) of the fan exhaust opening 335. At this time, the side on which the air discharged from the fan exhaust opening 335 has a faster flowing velocity may be located on the side where the flowing path length from the fan exhaust opening 335 to the air-leading duct outlet 348 is longer. As a result, there is a margin for the loss caused by the flowing path resistance, and therefore the effect on the airflow in the air-leading duct 346 can be reduced.

Figure 9:
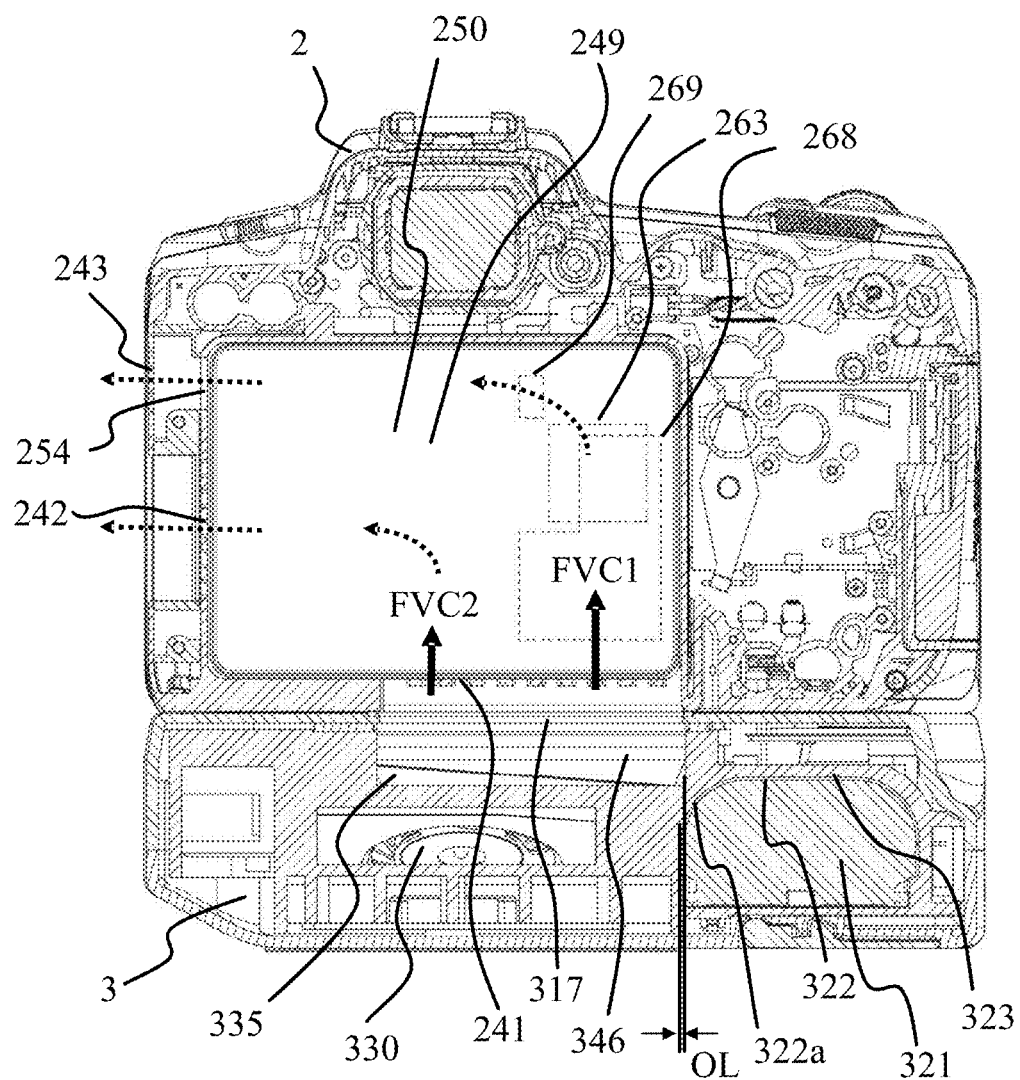
FIG. 9 is a rear sectional view of the cooling accessory and the camera main body.

Next, a description is given of a relationship between the first tilt and the second tilt of the fan 330. FIG. 9 illustrates a rear view section of the camera 2 with the cooling accessory 3 attached. In this drawing, the cooling accessory 3 and the camera 2 are cut at the center of the accessory air-leading opening 317 and the camera inlet opening 241 in the front-rear direction.

The battery housing portion 323 is provided on the right side of the cooling accessory 3 in the drawing. An accessory battery chamber 322, as a first functional unit relating to the function of the cooling accessory 3, in the battery housing portion 323 houses the battery 321. Left and right side portions 322a at upper parts of the accessory battery chamber 322 and the battery 321 are formed in a convex curved surface shape.

FIG. 9 illustrates part of the fan exhaust opening 335 on the far side (front side) of the air-leading duct 346. The first tilt of the fan 330 makes a near side (rear side) of the air-leading duct 346 located at a higher position than a position of the far side, and the second tilt of the fan 330 makes the near side located on the right side in the drawing as compared with the far side, and then the air-leading duct 346 is connected to the accessory air-leading opening 317 above it.

A portion (part) of the air-leading duct 346 near the accessory air-leading opening 317 overlaps the accessory battery chamber 322 by an overlap amount OL in the vertical direction (first direction). This overlapping portion is near the left and right side portions 322a at the upper part of the accessory battery chamber 322, and the air-leading duct 346 is efficiently placed inside the cooling accessory 3 in the positional relationship with the fan 330 having the first tilt and the second tilt. In other words, since the first tilt of the fan 330 makes the rear side of the air-leading duct 346 positioned higher than the front side of the air-leading duct 346, it is possible to realize the placement in which the second tilt of the fan 330 makes the air-leading duct 346 tilted to the right side in the drawing.

FIG. 9 illustrates the heat-radiation sheet metal 250 forming part of the camera duct portion 249. The two-dot chain line in the right area of the heat-radiation sheet metal 250 represents the image processing IC 263 disposed on the front side (far side in the drawing) of the heat-radiation sheet metal 250, and the dashed line represents the heat-conducting rubbers 268 and 269 in close contact with the thin heat radiation component 253 that overlaps the heat-radiation sheet metal 250 at the front side. Heat generated by the image processing IC 263 is transferred to the heat-radiation sheet metal 250 via the heat-conducting rubbers 268 and 269 and the thin heat radiation component 253. Although the thin heat radiation component 253 has a heat diffusion effect, the temperature of an area overlapping the heat-conducting rubbers 268 and 269 rises the most in the heat-radiation sheet metal 250.

The air fed from the lower side to the camera duct portion 249 from the accessory air-leading opening 317 via the camera inlet opening 241 flows inside the camera duct portion 249 while bending by 90° to the left as represented by the arrow in the drawing and discharged into the outside via the camera exhaust openings 242 and 243. The flowing velocity of the air fed from the camera inlet opening 241 to the camera duct portion 249 is affected by a flowing velocity distribution in the longitudinal direction of the fan exhaust opening 335 due to the characteristics of the centrifugal fan described above, and as represented by the lengths of the arrow FVC1 and the arrow FVC2 in the drawing, airflow is faster on the right side in the drawing.

That is, the camera duct portion 249 is formed at a position such that the camera duct portion 249 faces the area where the temperature is the highest on the heat-radiation sheet metal 250 (thermal connection area with the image processing IC 263: hereinafter referred to as a high temperature area), and the camera inlet opening 241 is placed at a position such that air flows in the camera duct portion 249 along the high temperature area. In this embodiment, the first and second tilts of the fan 330 in the cooling accessory 3 position the accessory air-leading opening 317 with respect to the camera inlet opening 241, whose position is fixed in the camera 2. Moreover, the second tilt of the fan 330 allows air to flow along the high temperature area in the camera duct portion 249. In addition, in this embodiment, the fan exhaust opening 335 in the cooling accessory 3 is located at a position as close to the camera duct portion 249 as possible so that air flows through the camera duct portion 249 at a high flowing velocity for efficient cooling.

The camera duct portion 249 has a long area extending from the high temperature area toward the camera exhaust openings 242 and 243 so that the cooling effect is enhanced by diffusing the heat in the high temperature area as widely as possible. In addition to the image processing IC 263, the camera 2 includes inside electronic components, such as an image sensor IS, which are other heat sources, and the long area extending from the high temperature area toward the camera exhaust openings 242 and 243 allows heat transferred from the above-described other heat sources to be discharged. For thermal connection between the other heat source and the heat-radiation sheet metal 250, various heat-conducting members such as heat-conducting rubber, graphite sheets, and heat pipes may be used.

Advantages of the arrangement of the fan 330 with the first tilt and the second tilt are summarized below.

A first advantage of the first tilt is the size reduction of the cooling accessory 3 as illustrated in FIG. 8. Specifically, first, by tilting, by the first tilt, the fan 330 that can draw air from the upper and lower fan inlet openings 333 and 334 of the casing 331, it is possible to form the upper and lower inlet ducts 347 and 345 connected to the upper and lower fan inlet openings 333 and 334 while the height of the cooling accessory 3 is reduced. Second, the height of the cooling accessory 3 can be reduced by arranging the tripod screwing mechanism 355, the tripod internal screw 307, and rotation stopping boss hole 308 in the areas that do not interfere with the upper and lower inlet ducts 347, 345 tilted along the fan 330 that is tilted by the first tilt. Third, since the fan 330 is housed in the front projecting portion 31 of the cooling accessory 3 while being tilted by the first tilt, the front projecting portion 31 can have a compact shape such that the distance from the outer peripheral surface of the interchangeable lens unit 4 becomes longer toward the front side. As a result, the operation on the interchangeable lens unit 4 and the operation on the above-described stop-narrowing button 206 of the camera 2 can be prevented from being hindered.

A second advantage of the first tilt is that, in the cooling accessory 3 having a limited height, tilting the fan 330 by the first tilt can loosen the bending of the air-leading duct 346 connecting the fan exhaust opening 335 to the accessory air-leading opening 317. As a result, the air discharged into the fan exhaust opening 335 can be smoothly fed from the accessory air-leading opening 317 to the camera inlet opening 241.

An advantage of the second tilt is that the width in the left-right direction of cooling accessory 3 can be reduced. If the battery housing portion 323 is shifted to the right outer side in the cooling accessory 3, the fan 330 does not need to be tilted by the second tilt. However, by tilting the fan 330 by the second tilt, it is possible to realize the cooling accessory 3 having a reduced width in the left-right direction and to provide the grip assisting surface 304.

Although a description is given of the cooling accessory 3 configured separately from the camera 2 in the above embodiment, a cooling apparatus corresponding to the cooling accessory may be provided integrally with an image pickup apparatus as a camera. Furthermore, although in the above embodiment, a description is given of a case where the cooling accessory 3 is provided with the accessory battery chamber 322 as the first functional unit, the functional unit may be a unit other than the battery chamber, such as an element forming an electronic circuit.

In the above embodiment, the fan 330 includes the fan inlet openings 333 and 334 on the upper and lower surfaces of the casing 331. However, a fan having a fan inlet opening on only one of the upper and lower surfaces of the casing may be used.

According to the above embodiment, it is possible to provide a small cooling apparatus that can efficiently feed cooling air to an electronic apparatus using a fan.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-030864, filed on Mar. 1, 2022, which is hereby incorporated by reference herein in its entirety.

What is claimed is:

1. A cooling apparatus that feeds cooling air to a heat exchanger of an electronic apparatus, the cooling apparatus comprising:
a fan; and
a body frame configured to hold the fan,
wherein the fan includes a blade configured to be housed in a casing and to rotate about a fan shaft, and discharges air drawn from a fan inlet opening of the casing into a fan exhaust opening of the casing, wherein the fan inlet opening surrounds the fan shaft, and wherein the fan exhaust opening is provided in a tangent line direction of a rotational direction of the blade,
wherein the body frame includes an air-leading duct configured to feed, to the heat exchanger, the air discharged into the fan exhaust opening,
wherein a first direction is a direction in which air is fed from the air-leading duct to the heat exchanger, a first plane is a plane orthogonal to the first direction, and a second plane is a plane parallel to the first direction, and
wherein the fan is tilted by a first tilt relatively to the first plane so that, in the first direction, the fan exhaust opening is closer to the heat exchanger than the blade, and is tilted by a second tilt about the fan shaft so that in a view from the first direction, the fan exhaust opening is tilted relatively to a direction parallel to the second plane.

2. The cooling apparatus according to claim 1, wherein in a second direction orthogonal to the first direction and parallel to the second plane, a center of the air-leading duct is located on a first side of the fan shaft, and
wherein the second tilt makes the fan tilt to the first side from an orientation at which the fan exhaust opening is parallel to the second plane.

3. The cooling apparatus according to claim 1, wherein the air-leading duct is formed from the fan exhaust opening to an outlet of the air-leading duct and is bent toward the first direction at an angle greater than 90°.

4. The cooling apparatus according to claim 1, wherein in the fan, a flowing velocity of air discharged from a first area of the fan exhaust opening is faster than a flowing velocity of air discharged from a second area of the fan exhaust opening, and
wherein the second tilt makes the fan tilt from an orientation at which the fan exhaust opening is parallel to the second plane so that a flowing path length from the first area to an outlet of the air-leading duct is longer than a flowing path length from the second area to the outlet of the air-leading duct.

5. The cooling apparatus according to claim 1, wherein the body frame holds a first functional unit relating to a function of the cooling apparatus, and
wherein when a second direction is a direction orthogonal to the first direction and parallel to the second plane, part in the second direction of the air-leading duct and the first functional unit overlap in the first direction.

6. The cooling apparatus according to claim 5, wherein the first functional unit is a battery chamber configured to house a battery for driving the fan.

7. The cooling apparatus according to claim 1, wherein the body frame includes an inlet duct configured to be connected to the fan inlet opening and to draw air from outside,
wherein the inlet duct is tilted relatively to the first plane so that the inlet duct extends along the fan tilted by the first tilt, and
wherein the body frame holds a second functional unit relating to a function of the cooling apparatus, and the second functional unit is provided in an area where the body frame and the inlet duct overlap in the first direction.

8. The cooling apparatus according to claim 7, wherein the second functional unit is an attachment mechanism for attaching the cooling apparatus to the electronic apparatus or other members.

9. The cooling apparatus according to claim 1, wherein the casing includes, as the fan inlet opening, a first fan inlet opening and a second fan inlet opening on both sides in a direction in which the fan shaft extends, wherein the body frame includes a first inlet duct and a second inlet duct that are respectively connected to the first fan inlet opening and the second fan inlet opening and draw air from outside, and wherein an inlet opening of the first inlet duct and an inlet opening of the second inlet duct are provided on different sides of the body frame.

10. The cooling apparatus according to claim 1, wherein the electronic apparatus is an image pickup apparatus to which a lens unit is detachably attachable or with which a lens unit is integrally provided, wherein the body frame includes a projection portion projecting with respect to the image pickup apparatus in a lens extending direction in which the lens unit extends from the image pickup apparatus, wherein part of the fan tilted by the first tilt is placed inside the projecting portion, and wherein a surface facing the lens unit of the projection portion is tilted so that the surface becomes farther from an optical axis of the lens unit as the surface extends in the lens extending direction.

11. An electronic apparatus comprising:
a heat exchanger; and
a cooling apparatus configured to feed cooling air to the heat exchanger,
wherein the cooling apparatus includes:
a fan; and
a body frame configured to hold the fan,
wherein the fan includes a blade configured to be housed in a casing and to rotate about a fan shaft, and discharges air drawn from a fan inlet opening of the casing into a fan exhaust opening of the casing, wherein the fan inlet opening surrounds the fan shaft, and wherein the fan exhaust opening is provided in a tangent line direction of a rotational direction of the blade,
wherein the body frame includes an air-leading duct configured to feed, to the heat exchanger, the air discharged into the fan exhaust opening,
wherein a first direction is a direction in which air is fed from the air-leading duct to the heat exchanger, a first plane is a plane orthogonal to the first direction, and a second plane is a plane parallel to the first direction, and wherein the fan is tilted by a first tilt relatively to the first plane so that, in the first direction, the fan exhaust opening is closer to the heat exchanger than the blade, and is tilted by a second tilt about the fan shaft so that in a view from the first direction, the fan exhaust opening is tilted relatively to a direction parallel to the second plane.

12. An image pickup apparatus as an electronic apparatus comprising:
an image sensor;
a processing element configured to process a signal output from the image sensor;
a heat exchanger to which at least one of the image sensor and the processing element is thermally connected; and
a cooling apparatus configured to feed cooling air to the heat exchanger,
wherein the cooling apparatus includes:
a fan; and
a body frame configured to hold the fan,
wherein the fan includes a blade configured to be housed in a casing and to rotate about a fan shaft, and discharges air drawn from a fan inlet opening of the casing into a fan exhaust opening of the casing, wherein the fan inlet opening surrounds the fan shaft, and wherein the fan exhaust opening is provided in a tangent line direction of a rotational direction of the blade,
wherein the body frame includes an air-leading duct configured to feed, to the heat exchanger, the air discharged into the fan exhaust opening,
wherein a first direction is a direction in which air is fed from the air-leading duct to the heat exchanger, a first plane is a plane orthogonal to the first direction, and a second plane is a plane parallel to the first direction, and
wherein the fan is tilted by a first tilt relatively to the first plane so that, in the first direction, the fan exhaust opening is closer to the heat exchanger than the blade, and is tilted by a second tilt about the fan shaft so that in a view from the first direction, the fan exhaust opening is tilted relatively to a direction parallel to the second plane.

* * * * *